United States Patent
Kolics

(10) Patent No.: US 8,980,746 B2
(45) Date of Patent: Mar. 17, 2015

(54) ADHESION LAYER FOR THROUGH SILICON VIA METALLIZATION

(71) Applicant: Lam Research Corporation, Fremont, CA (US)

(72) Inventor: Artur Kolics, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 39 days.

(21) Appl. No.: 13/966,168

(22) Filed: Aug. 13, 2013

(65) Prior Publication Data

US 2015/0050808 A1 Feb. 19, 2015

(51) Int. Cl.
*H01L 21/28* (2006.01)
*H01L 21/768* (2006.01)

(52) U.S. Cl.
CPC .................. *H01L 21/76879* (2013.01)
USPC ............. 438/667; 438/687; 257/E21.597

(58) Field of Classification Search
USPC ................ 438/627, 628, 629, 666, 667, 687; 257/E21.597
See application file for complete search history.

(56) References Cited

U.S. PATENT DOCUMENTS 8,753,975 B1 * 6/2014 Zhang et al. .................. 438/637
2010/0090342 A1 4/2010 Chang et al.

OTHER PUBLICATIONS

Lin et al., "The Effects of Al Doping and Metallic-Cap Layers on Electromigration Transport Mechanisms in Copper Nanowires," IEEE Transactions on Device and Materials Reliability, vol. 11, No. 4, Dec. 2011 pp. 540-547.

* cited by examiner

*Primary Examiner* — Thanhha Pham
(74) *Attorney, Agent, or Firm* — Beyer Law Group LLP

(57) ABSTRACT

To achieve the foregoing and in accordance with the purpose of the present invention, a method for forming copper filled through silicon via features in a silicon wafer is provided. Through silicon vias are etched in the wafer. An insulation layer is formed within the through silicon vias. A barrier layer is formed within the through silicon vias. An oxide free silicon, germanium, or SiGe adhesion layer is deposited over the barrier layer. A seed layer is deposited over the adhesion layer then the wafers is annealed. The features are filled with copper or copper alloy. The stack is annealed.

19 Claims, 5 Drawing Sheets

ADHESION LAYER FOR THROUGH SILICON VIA METALLIZATION

BACKGROUND OF THE INVENTION

Field of the Invention

The invention relates to a method of forming semiconductor devices on a semiconductor wafer. More specifically, the invention relates to forming through via metallization.

Silicon semiconductors containing through silicon (Si) vias are used in a variety of technologies, from imaging products and memory to high-speed logic and high voltage device products. One technology that relies heavily on vias formed through silicon semiconductor wafers is a three dimensional (3D) integrated circuit (IC). 3D ICs are created by stacking thinned semiconductor wafer chips and interconnecting them with Through Silicon Vias (TSVs).

SUMMARY OF THE INVENTION

To achieve the foregoing and in accordance with the purpose of the present invention, a method for forming copper filled through silicon via features in a silicon wafer is provided. Through silicon vias are etched in the wafer. An insulation layer is formed within the through silicon vias. A barrier layer is formed within the through silicon vias. An oxide free silicon, germanium, or SiGe adhesion layer is deposited over the barrier layer. A seed layer is deposited over the adhesion layer. This step is followed by annealing. The features are filled with copper or copper alloy and goes through a second anneal.

In another manifestation of the invention, a method for forming copper filled features in a silicon layer is provided. A barrier layer is formed within features in the silicon layer. A silicon, germanium, or SiGe adhesion layer is deposited over the barrier layer. A seed layer is deposited over the adhesion layer. The features are filled with copper or copper alloy and the wafer is annealed.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
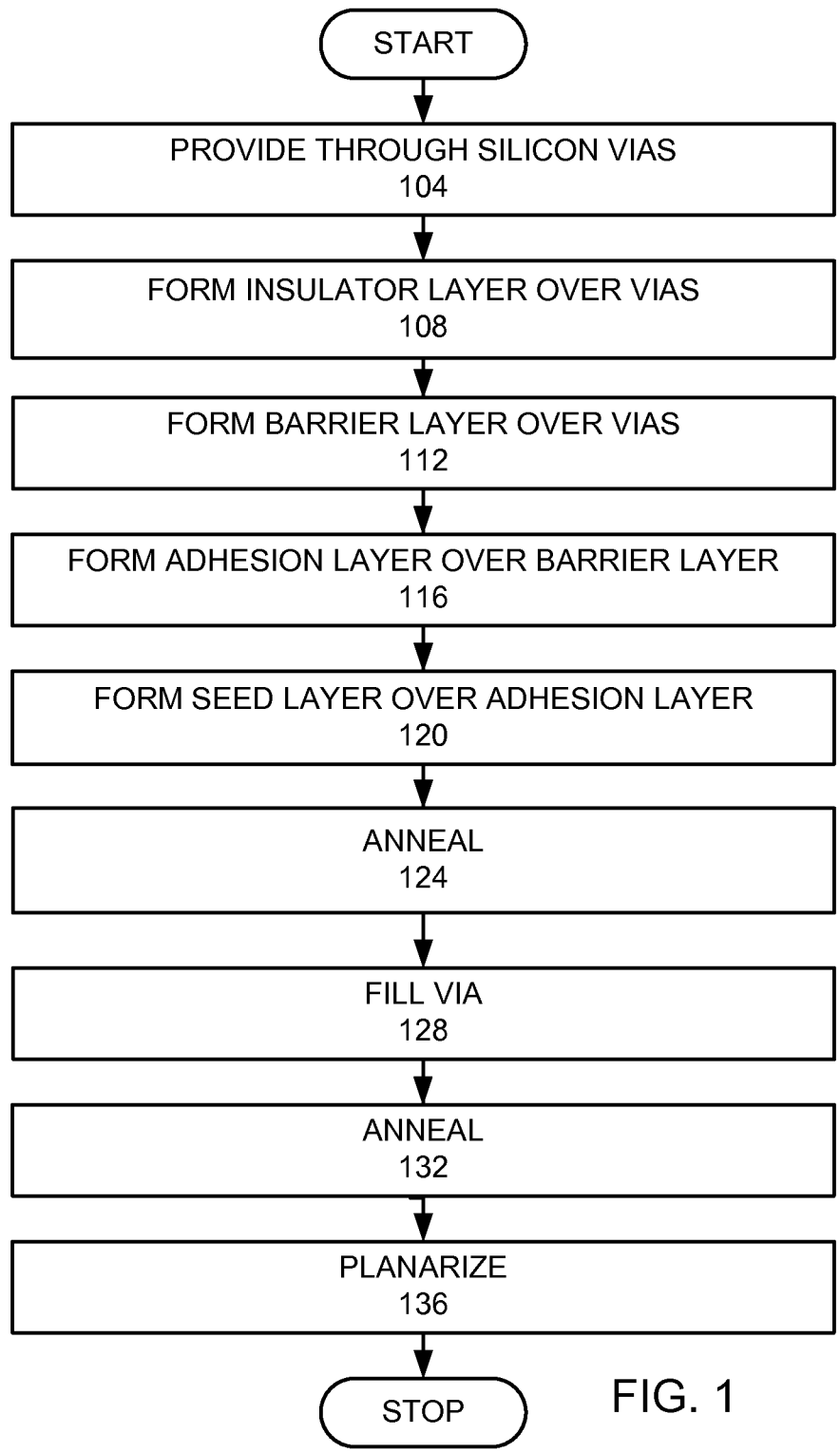
FIG. 1 is a flow chart of an embodiment of the invention.

FIG. 1 is a high level flow chart of an embodiment of the invention. Through silicon vias are provided (step 104). An insulator layer (most often silicon oxide or silicon oxide based) is formed over the through silicon vias (step 108). A barrier layer is formed over the silicon vias (step 112). An adhesion layer is formed over the barrier layer (step 116). A seed layer is formed over the adhesion layer (step 120) then the wafer is annealed (step 124). The through silicon vias are filled (step 128). The stack is annealed (step 132). The stack is subjected to a planarization (step 136).

Figure 2A:
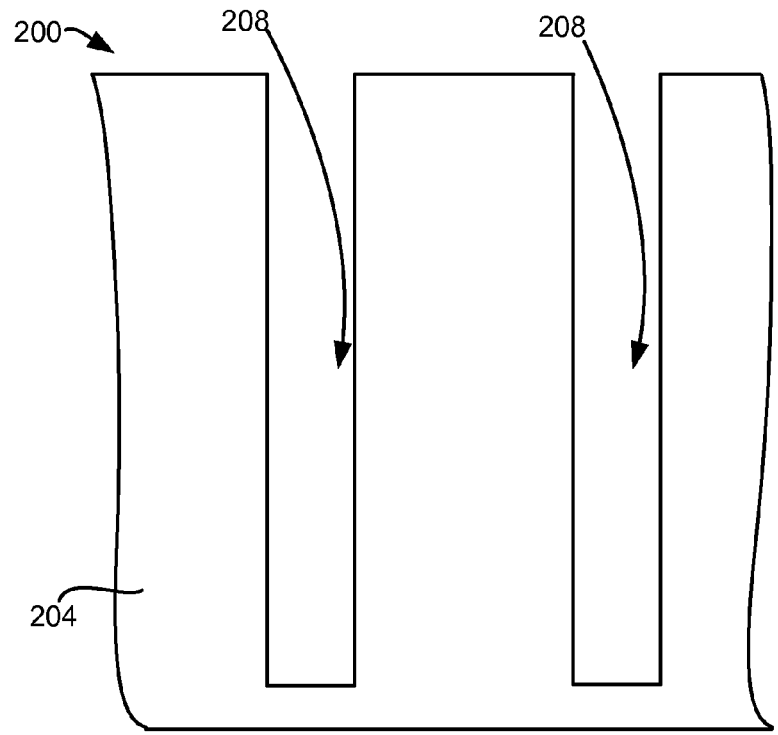
FIGS. 2A-G are schematic views of the formation of structures using the inventive process.

In a preferred embodiment of the invention, through silicon vias in a substrate are provided (step 104). FIG. 2A is a schematic cross-sectional view of a stack 200 with a substrate 204 with through silicon vias 208. The through silicon vias 208 may pass entirely through the silicon substrate 204 or partially through the silicon substrate 204. Normally, if the through silicon vias 208 do not pass entirely through the silicon substrate 204, a subsequent process is provided to remove the parts of the silicon substrate 204 through which the through silicon vias 208 do not pass, so that the through silicon vias 208 pass through the remaining substrate 204. Preferably, the through silicon vias 208 have a width less than 15 µm. More preferably, the through silicon vias 208 have an aspect ratio greater than 8:1. Preferably, the through silicon vias 208 have a depth greater than 5 µm.

Figure 2B:
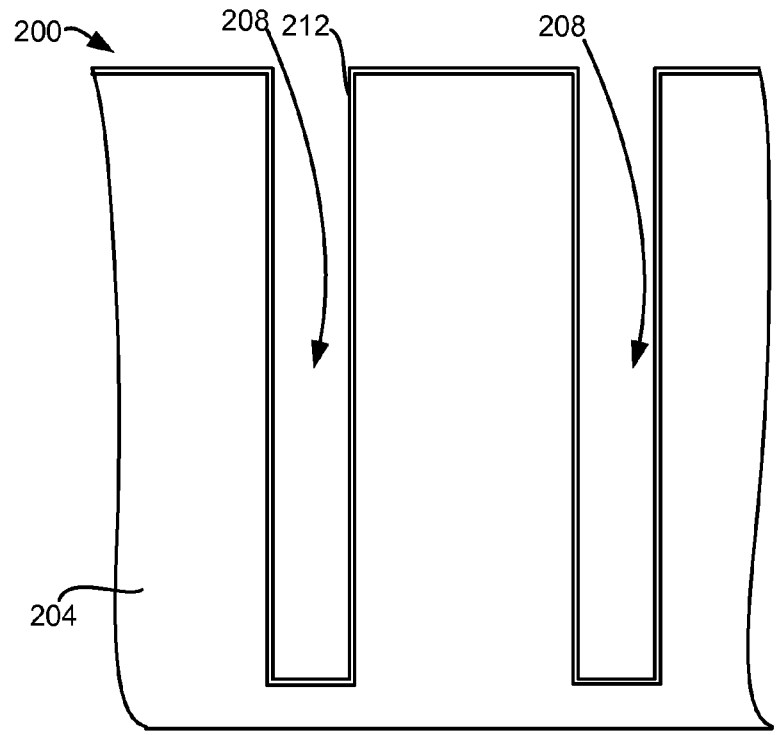

An insulator layer is formed over the through silicon vias (step 108). FIG. 2B is a schematic cross-sectional view of the stack 200 after an insulator layer 212 is formed over the through silicon vias 208. Silicon oxide, the most commonly used dielectric, can be deposited by chemical vapor deposition (CVD) or atomic layer deposition (ALD) processes or thermally grown from Si in an oxidizing atmosphere to form the insulator layer 212.

Figure 2C:
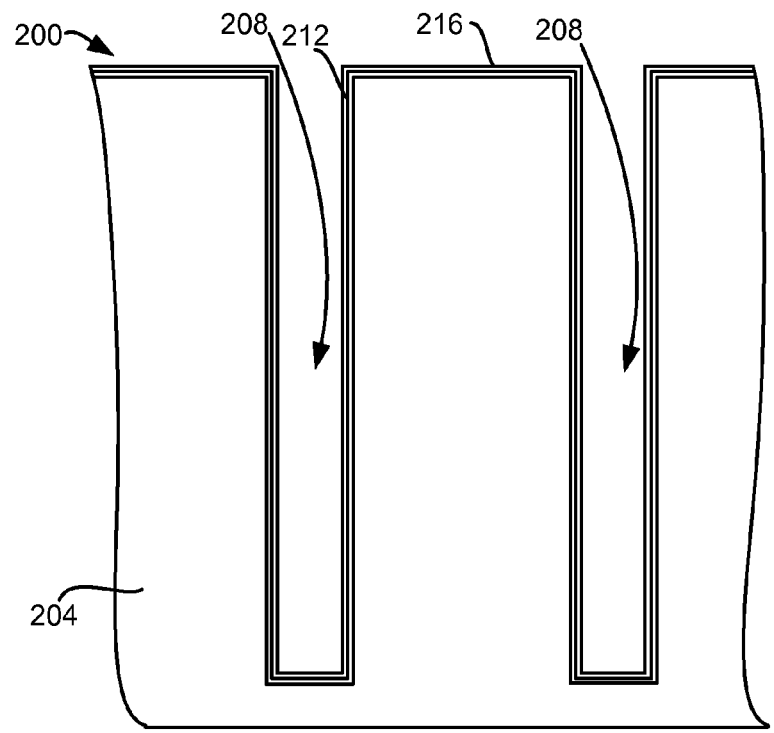

A barrier layer is formed over the vias (step 112). FIG. 2C is a schematic cross-sectional view of the stack 200 after the barrier layer 216 is formed over the insulator layer 212. Preferably, the barrier layer 216 comprises at least one of tungsten nitride, TiN, TiW, TiSN, WSiN, or RuTiN. More preferably, the barrier layer 216 comprises >10% tungsten by weight. The barrier layer 216 can also be deposited by physical vapor deposition (PVD), CVD, or ALD processes though the latter two are preferred due to the higher conformality of the layer they can provide, since CVD and ALD provide plating even in very high aspect ratio vias (>17:1). In other embodiments, the barrier layer 216 comprises a combination of one or more of W, Ti, Ta, N, Si, O, or C.

Figure 2D:
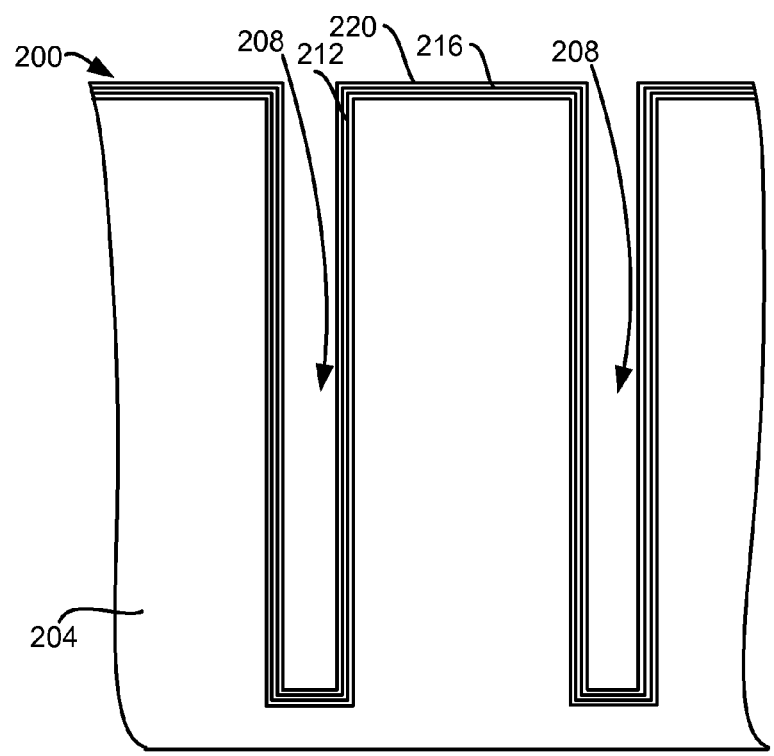

An adhesion layer is formed over the barrier layer (step 116). Preferably, the adhesion layer is formed by an electroless deposition (ELD), atomic layer deposition (ALD), or chemical vapor deposition (CVD) process depositing a silicon, germanium, or silicon germanium (SiGe) layer. Such adhesion layer can be formed by using $SiH_4$, $GeH_4$ other hydrogen containing silicon and/or germanium compounds. The thickness of such layer can range from 20 Å to 500 Å, preferably between 50 Å to 100 Å. FIG. 2D is a schematic cross-sectional view of the stack 200 after the adhesion layer 220 is formed over the barrier layer 216.

Figure 2E:
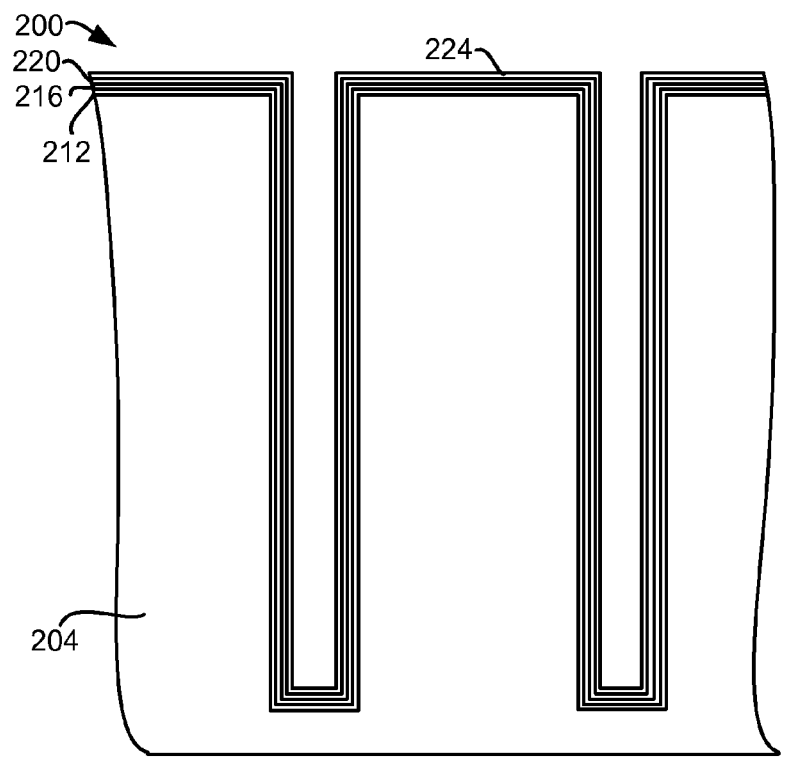

A seed layer is formed over the adhesion layer (step 120). In this embodiment, the seed layer is formed by electroless deposition (ELD) or electroplating (ECP). In an example of the deposition of a seed layer, the ELD solution has a pH between 4.0 and 12.5, and more preferably, between 7.5 and 10.5. The deposition is done at temperatures between room temperature to 95° C., and more preferably, between 65° C. to 85° C. The solution contains at least one or more metal compounds (such as but not limited to chloride or sulfate salts of the metal(s)), pH adjustor(s) which may also function as a complexing agent, additional complexing agent if needed, and one or more reducing agents. The electroless plating solution can also contain other additives such as surfactants, stabilizers, stress reducers, etc. FIG. 2E is a schematic cross-sectional view of the stack 200 after the seed layer 224 is formed over the adhesion layer 220.

The wafer is annealed after the seed layer formed on the adhesion layer (step 124). In this embodiment, the annealing is performed at a temperature in the range of 150° C. to 450° C. for a time from 1 minute to 60 minutes. More preferably, the anneal is at a temperature of 250° C. to 400° C. for a time between 5 minutes to 30 minutes.

Figure 2F:
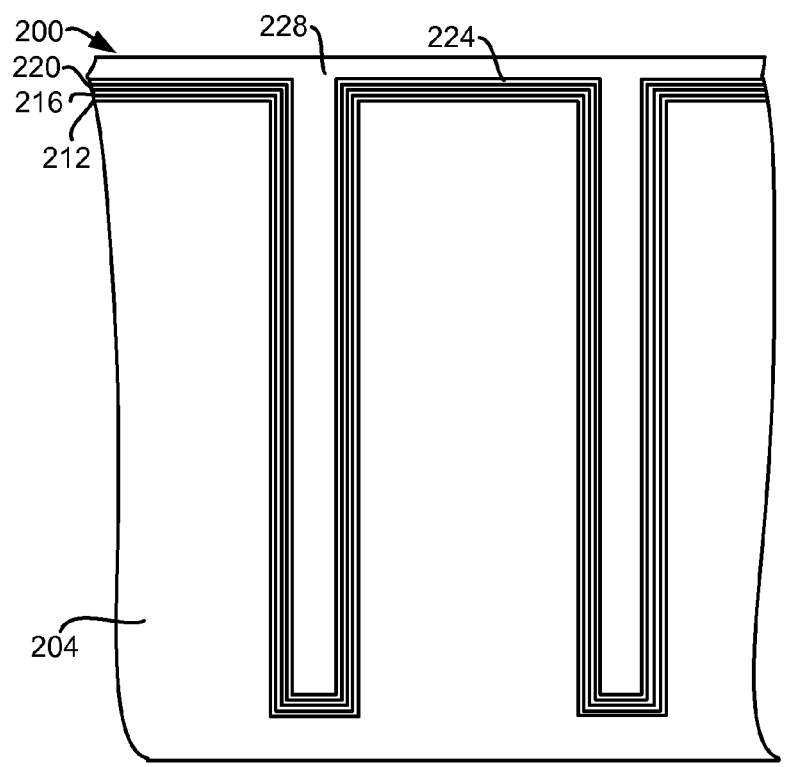

The vias are then filled (step 128). In an example of a filling process, an electroplating copper or copper alloy solution used for filling is acidic and operates at temperatures between 15° C. to 90° C., and more preferably, between 20° C. and 45° C. The solution contains at least one or more metal compounds (such as but not limited to chloride or sulfate salts of the metal(s)), pH adjustor(s) and the necessary additives from the group of suppressors, accelerators and levelers that provides bottom up fill. FIG. 2F is a schematic cross-sectional view of the stack 200 after the vias are filled with a copper or copper alloy fill 228. In other embodiments ELD, chemical vapor deposition (CVD), or atomic layer deposition (ALD) may be used to provide the copper or copper alloy fill 228.

The stack 200 is subjected to another anneal (step 132). In this embodiment, the annealing is performed at a temperature in the range of 150° C. to 450° C. for a time from 1 minute to 60 minutes. More preferably, the anneal is at a temperature of 250° C. to 400° C. for a time between 5 minutes to 30 minutes.

Figure 2G:
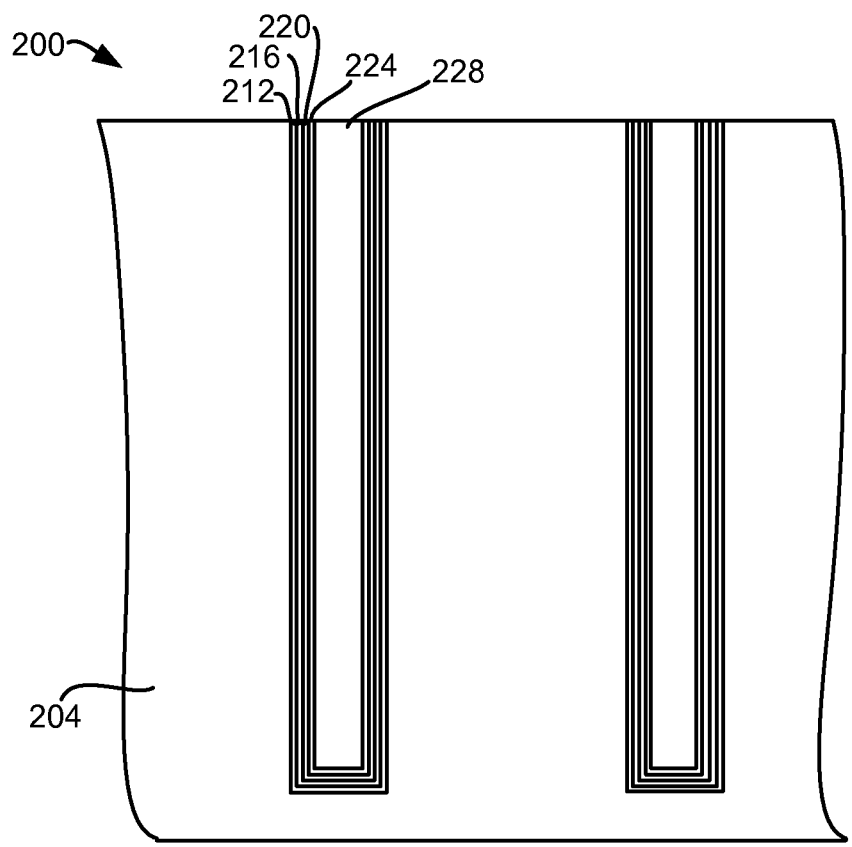

The stack 200 is then planarized (step 136). In this embodiment, the copper or copper alloy fill 228 outside the through silicon vias 208 (field) has a thickness of less than 8000 Å. The planarization process may be used to planarize the stack 200 to remove the copper or copper alloy fill 228, the seed layer 224, the adhesion layer 220, the barrier layer 216, and insulator layer 212 above the through silicon vias 208. Chemical mechanical polishing (CMP) is an example of such a planarization process. FIG. 2G is a schematic cross-sectional view of the stack 200 after the stack 200 has been planarized using a CMP process.

Embodiments of the invention allow for the filling of through silicon vias at a reduced cost. In addition, various embodiments can provide a uniform barrier layer, even where aspect ratios of the TSV are 20:1 or higher.

Other embodiments of the invention may provide additional liner, barrier or seed layers. Embodiments may use an ELD barrier layer of a Co or Ni alloy, where the alloying elements preferably comprise Co, Ni, Fe, W, Mo, P, B, Re, Mn, Cr, Ge, Sn, In, Ga, or Cu. Embodiments of the invention use an electroless liner or seed layer comprising a Co, Ni, or Cu alloy, where the alloying elements preferably comprise Co, Ni, Fe, W, Mo, P, B, Re, Mn, Cr, Ge, Sn, In, or Ga. In other embodiments, the electroplating seed can be metals or metal alloys that have low solubility in conventional acidic electroplating solutions used for filling TSV structures. For example, the seed can be Cu or Cu alloy, but is not restricted to CuNi, CuCo, CuMn, CuSn, and CuAg, but may be other metal alloy combinations, such as Ni, NiCo, Pd, Ru, etc. This allows the electroplated layer to be nearly the same as the electroplated seed.

In other embodiments, a single anneal may be provided after the vias are filled (step 128) without an anneal before the vias are filled (step 128). Such an anneal would be used to promote the interdiffusion between the adhesion layer 220 and the seed layer 224 and to grow the grains of the copper or copper alloy fill.

The silicon, germanium, or SiGe adhesion layer is not an insulator layer, and therefore is preferably oxide free, since silicon oxide is an insulator. More preferably, if the adhesion layer is silicon, it is pure silicon, or if the adhesion layer is germanium it is pure germanium, or if the adhesion layer is SiGe, it is pure SiGe though implanted Si or Ge can also be used (in this case the implant concentration is less than 1%. Silicon and germanium are able to move into copper. The silicon, germanium, or SiGe adhesion layer is able to move into the copper with annealing to improve adhesion.

Other embodiments may fill deep features that are not through silicon vias. However, preferably such features should be wide and deep enough to accommodate the various layers.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming copper filled through silicon via features in a silicon wafer, comprising:
    etching through silicon vias in the silicon wafer;
    forming an insulation layer within the through silicon vias;
    forming a barrier layer within the through silicon vias;
    depositing an oxide free silicon, germanium, or SiGe adhesion layer over the barrier layer;
    depositing a seed layer over the oxide free silicon, germanium, or SiGe adhesion layer;
    annealing a stack comprising the insulation layer, the barrier layer, the oxide free silicon, germanium or SiGe adhesion layer and the seed layer;
    filling the through silicon vias with copper or copper alloy; and
    annealing a stack comprising the insulation layer, the barrier layer, the oxide free silicon, germanium or SiGe adhesion layer, the seed layer and the copper or copper alloy.

2. The method, as recited in claim 1, further comprising providing a chemical mechanical polishing of the silicon wafer.

3. A method for forming copper filled features in a silicon layer, comprising:
    forming a barrier layer within features in the silicon layer;
    depositing a silicon, germanium, or SiGe adhesion layer over the barrier layer;
    depositing a seed layer over the silicon, germanium, or SiGe adhesion layer;
    filling the features with copper or copper alloy; and
    annealing the features.

4. The method, as recited in claim 3, wherein the filling the features with copper or copper alloy is an electroless deposition process or electroplating process.

5. The method, as recited in claim 4, further comprising depositing an insulator layer within the features before forming the barrier layer.

6. The method, as recited in claim 5, wherein the features are through silicon via features.

7. The method, as recited in claim 6, further comprising etching features in the silicon layer.

8. The method, as recited in claim 7, wherein the silicon, germanium, or SiGe adhesion layer is oxide free.

9. The method, as recited in claim 8, wherein the annealing is performed after filling the features.

10. The method, as recited in claim 9, providing a chemical mechanical polishing after the annealing.

11. The method, as recited in claim 8, wherein the annealing is performed after depositing the seed layer and before filling the features.

12. The method, as recited in claim 11, further comprising providing a chemical mechanical polishing after filling the features.

13. The method, as recited in claim 12, further comprising providing a second anneal after filling the features.

14. The method, as recited in claim 3, wherein the features are through silicon via features.

15. The method, as recited in claim 3, further comprising etching features in the silicon layer.

16. The method, as recited in claim 3, wherein the silicon, germanium, or SiGe adhesion layer is oxide free.

17. The method, as recited in claim 3, wherein the annealing is performed after filling the features.

18. The method, as recited in claim 17, providing a chemical mechanical polishing after the annealing.

19. The method, as recited in claim 3, wherein the annealing is performed after depositing the seed layer and before filling the features.

* * * * *